(12) United States Patent
Noda

(10) Patent No.: US 8,445,349 B2
(45) Date of Patent: May 21, 2013

(54) METHOD OF MANUFACTURING NONVOLATILE SEMICONDUCTOR MEMORY DEVICE

(75) Inventor: Mitsuhiko Noda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/358,633

(22) Filed: Jan. 26, 2012

(65) Prior Publication Data
US 2013/0023099 A1 Jan. 24, 2013

(51) Int. Cl.
*H01L 21/336* (2006.01)
(52) U.S. Cl.
USPC .......................................... 438/287; 438/216
(58) Field of Classification Search
USPC .......................................................... 438/287
See application file for complete search history.

(56) References Cited

U.S. PATENT DOCUMENTS

| 2010/0221880 A1* | 9/2010 | Yaegashi | 438/258 |
| 2010/0237398 A1* | 9/2010 | Kamigaichi et al. | 257/316 |
| 2011/0248329 A1* | 10/2011 | Yaegashi et al. | 257/316 |
| 2012/0126302 A1* | 5/2012 | Noda et al. | 257/315 |

FOREIGN PATENT DOCUMENTS
JP 2009-194305 8/2009

* cited by examiner

*Primary Examiner* — Charles Garber
*Assistant Examiner* — Brigitte Paterson
(74) *Attorney, Agent, or Firm* — Oblon, Spivak, McClelland, Maier & Neustadt, L.L.P.

(57) ABSTRACT

In one embodiment, a method of manufacturing a nonvolatile semiconductor memory includes forming a plurality of memory cell transistors and a plurality of selection transistors on a substrate. The method further includes burying first and second insulators successively between memory cell transistors and between a memory cell transistor and a selection transistor, and forming the first and second insulators successively on side surfaces of selection transistors, the side surfaces facing a space between the selection transistors. The method further includes burying third to fifth insulators successively between the selection transistors via the first and second insulators. The method further includes removing the second and fourth insulators by a first etching so that the second and fourth insulators partially remain between the selection transistors. The method further includes removing the second and fourth insulators remaining between the selection transistors by a second etching performed after the first etching.

20 Claims, 19 Drawing Sheets

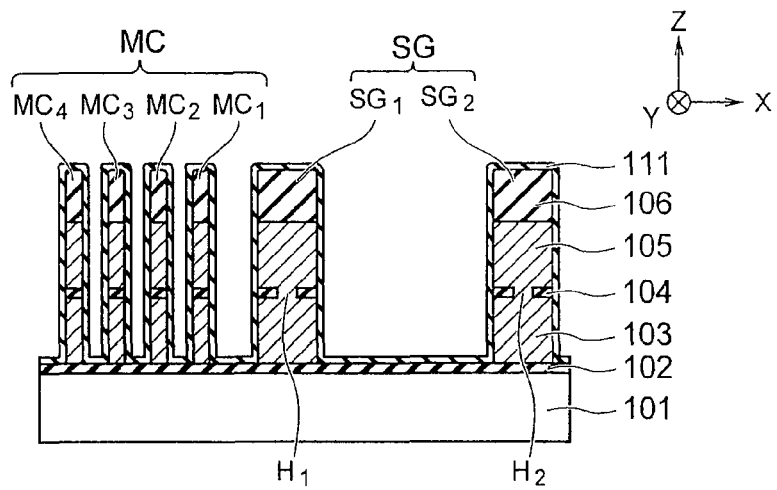
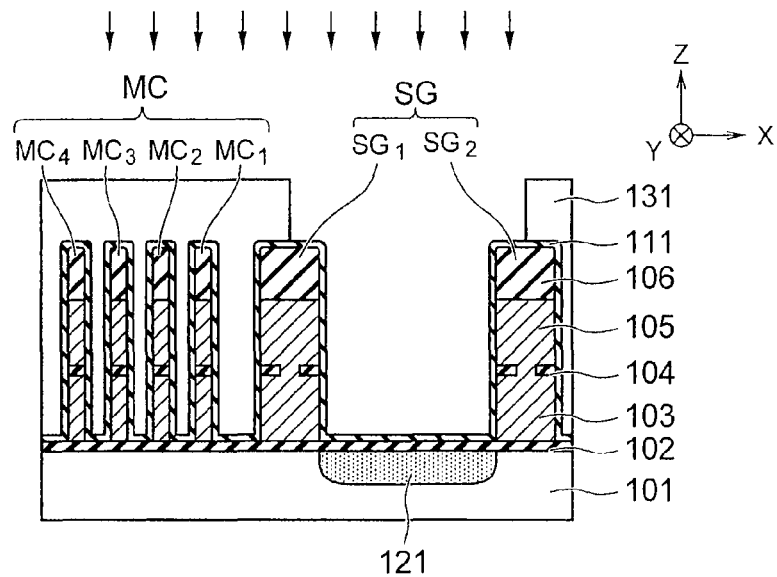
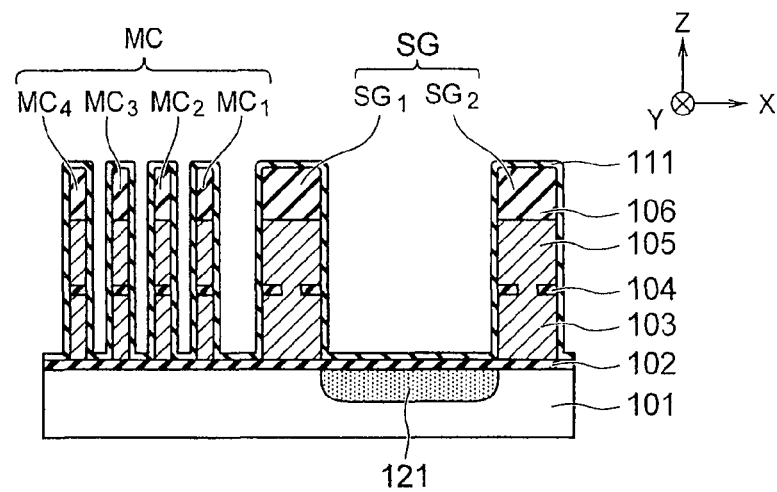

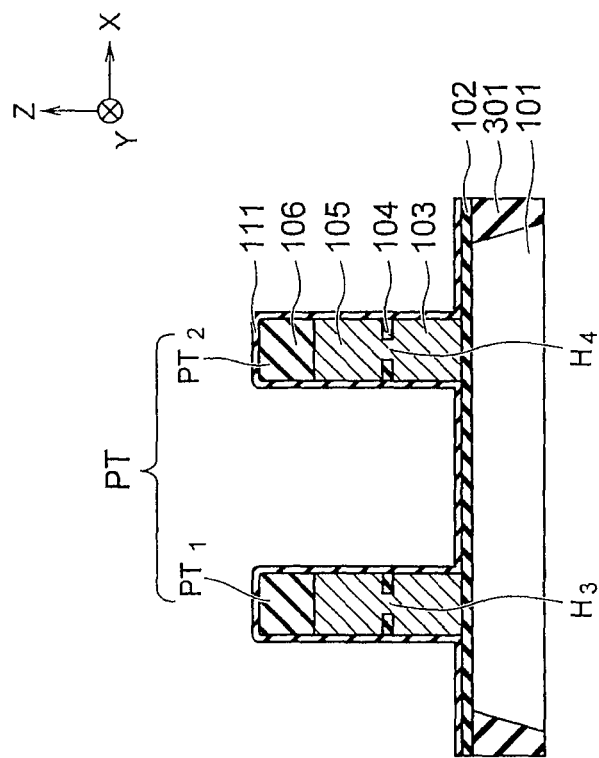
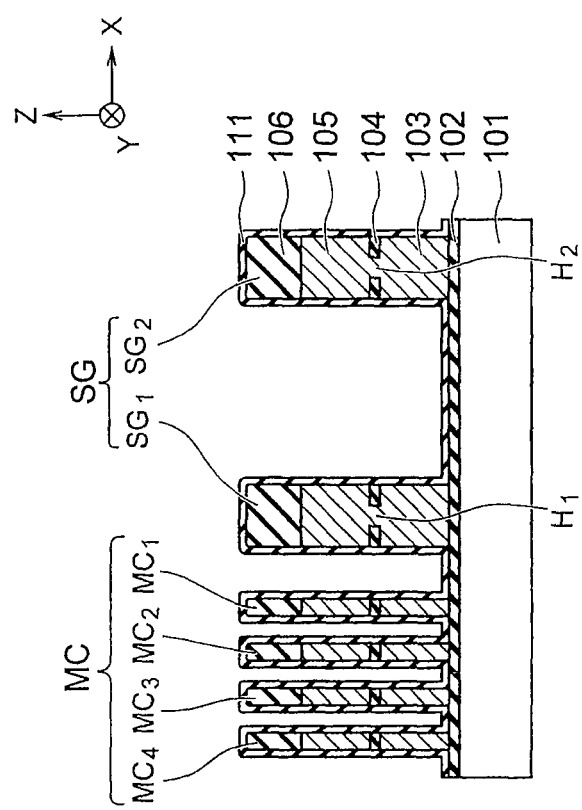
FIG.6A
FIG.6B

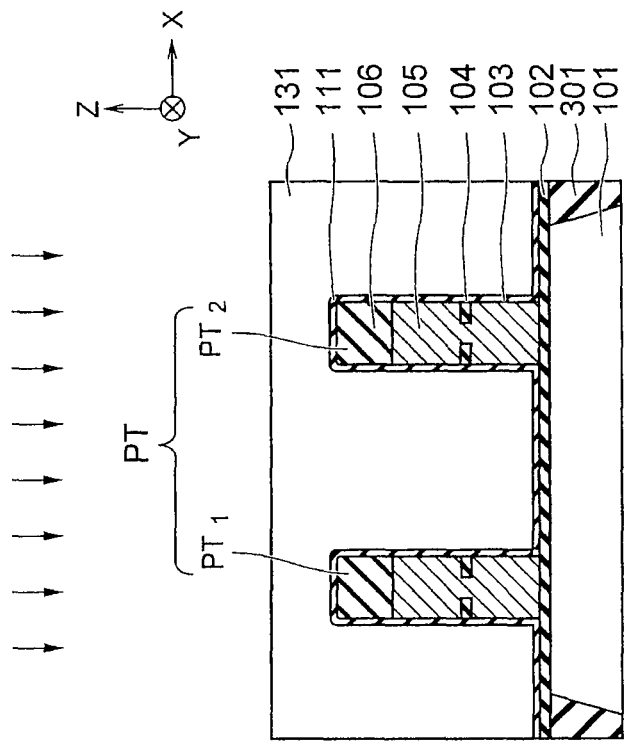
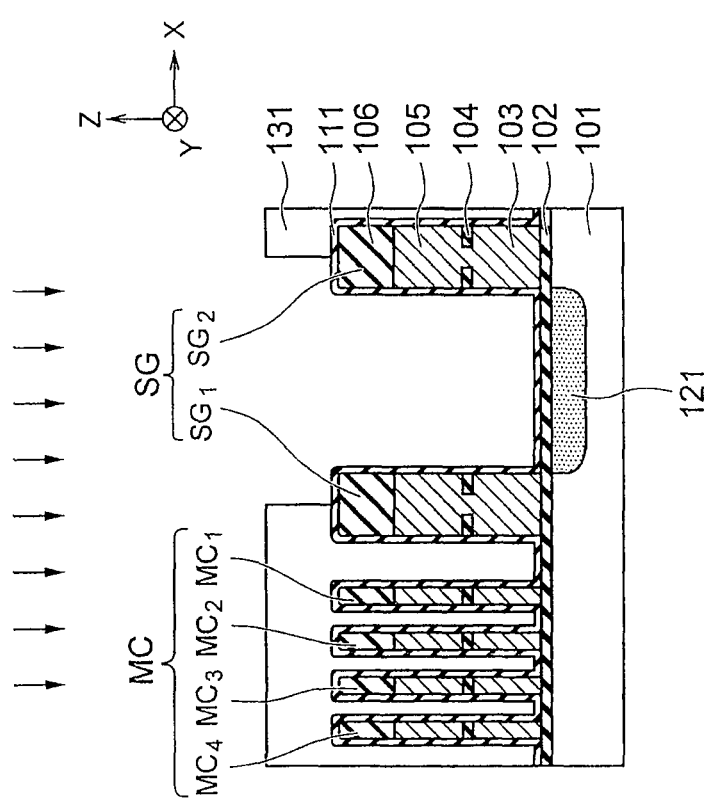
FIG. 7A
FIG. 7B

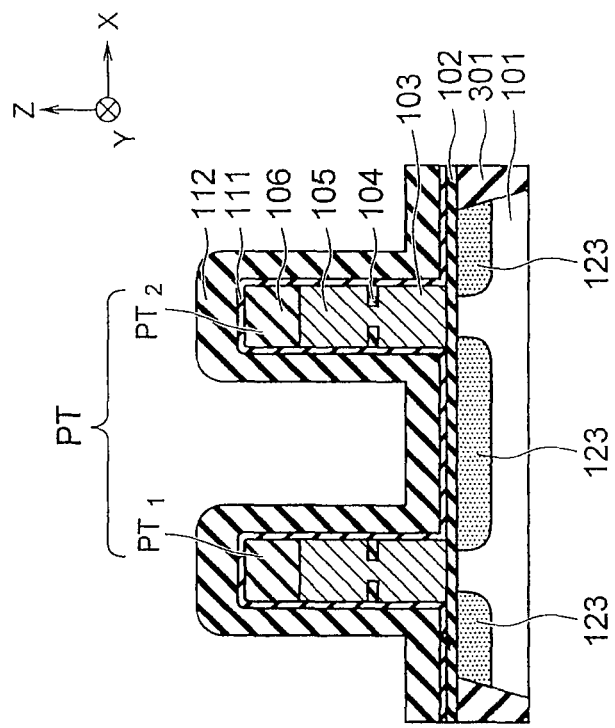
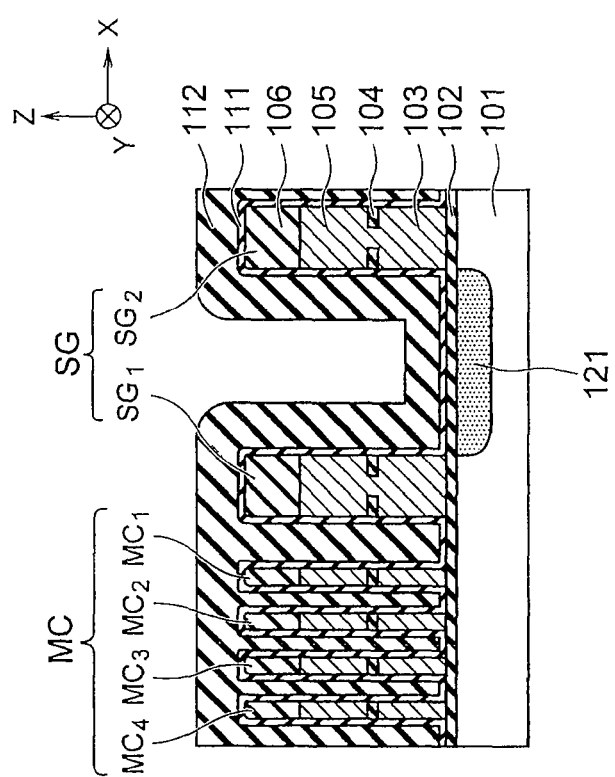
FIG.9A
FIG.9B

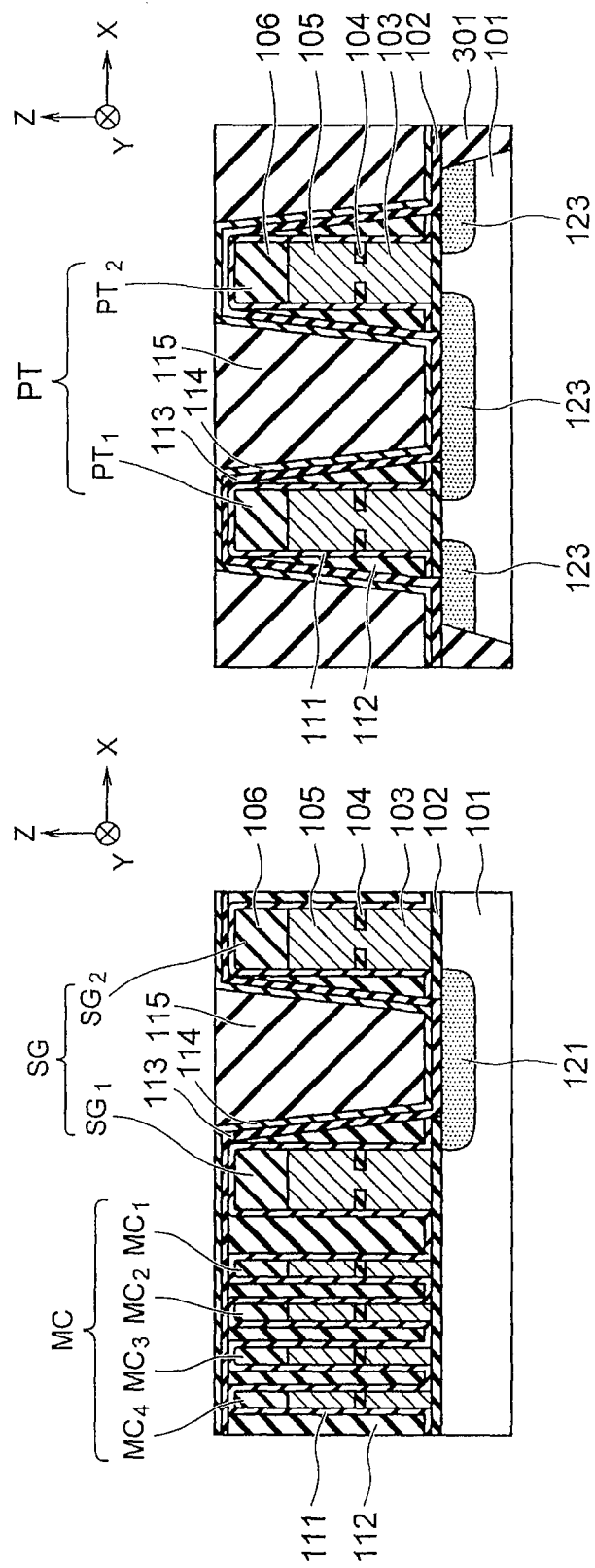

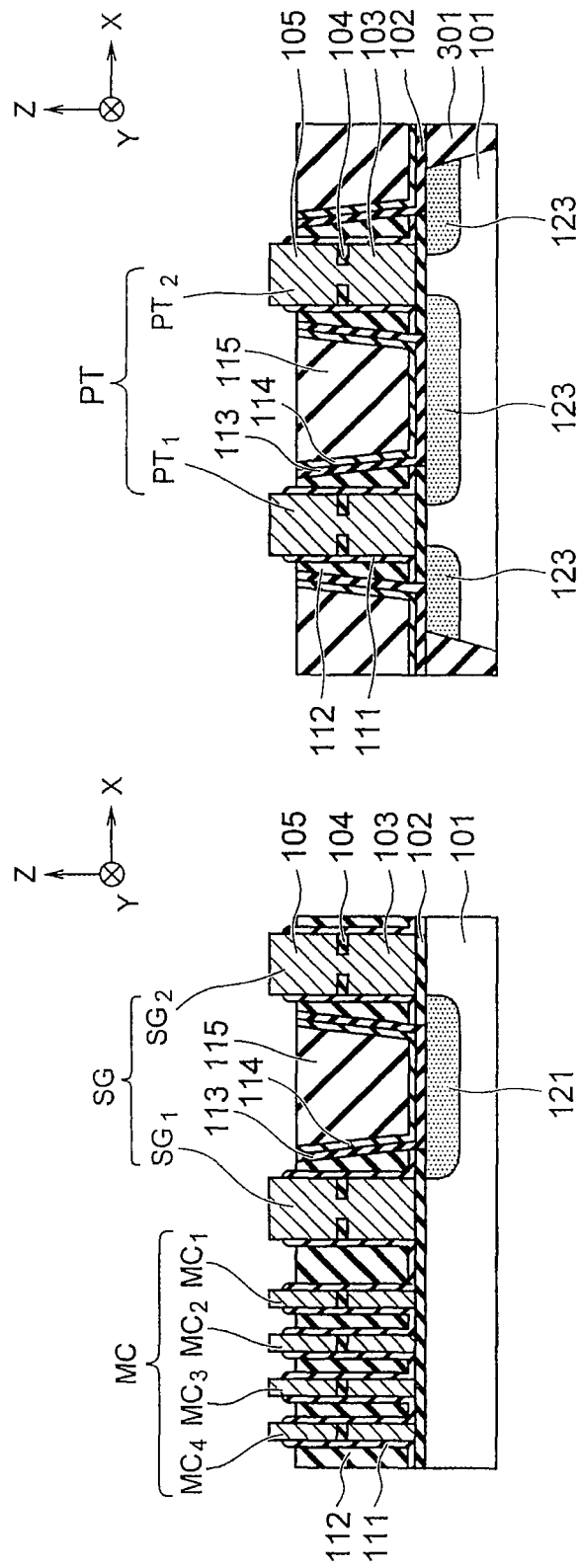

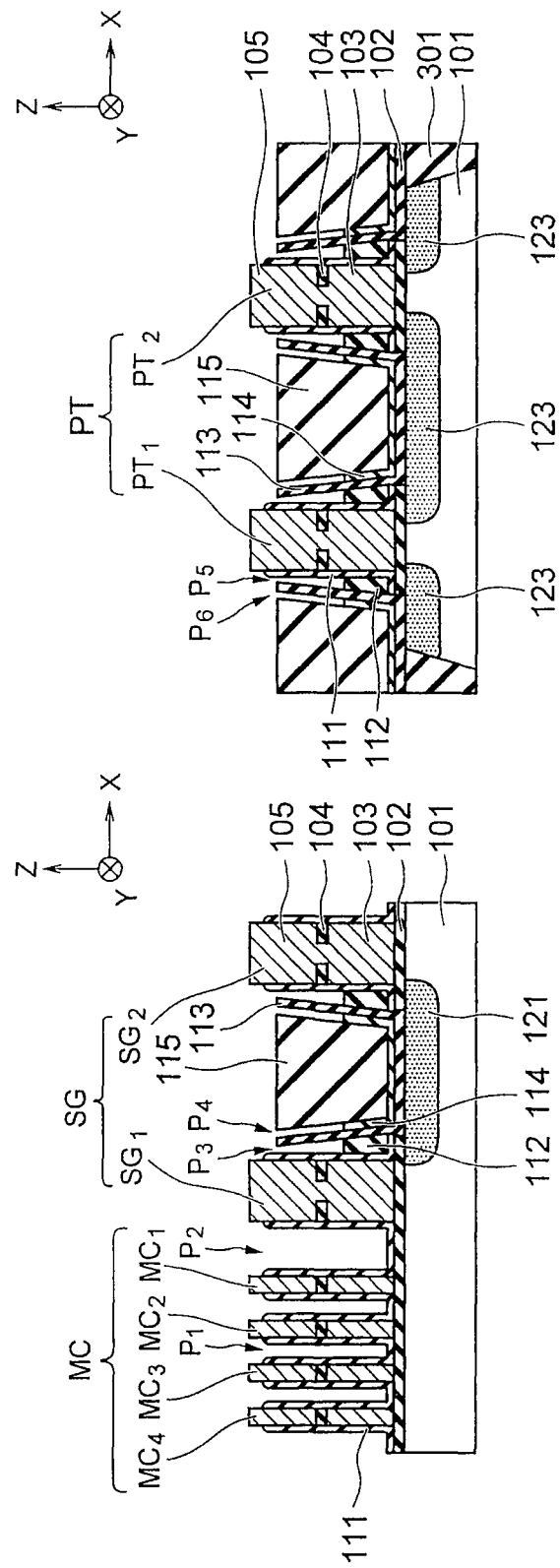

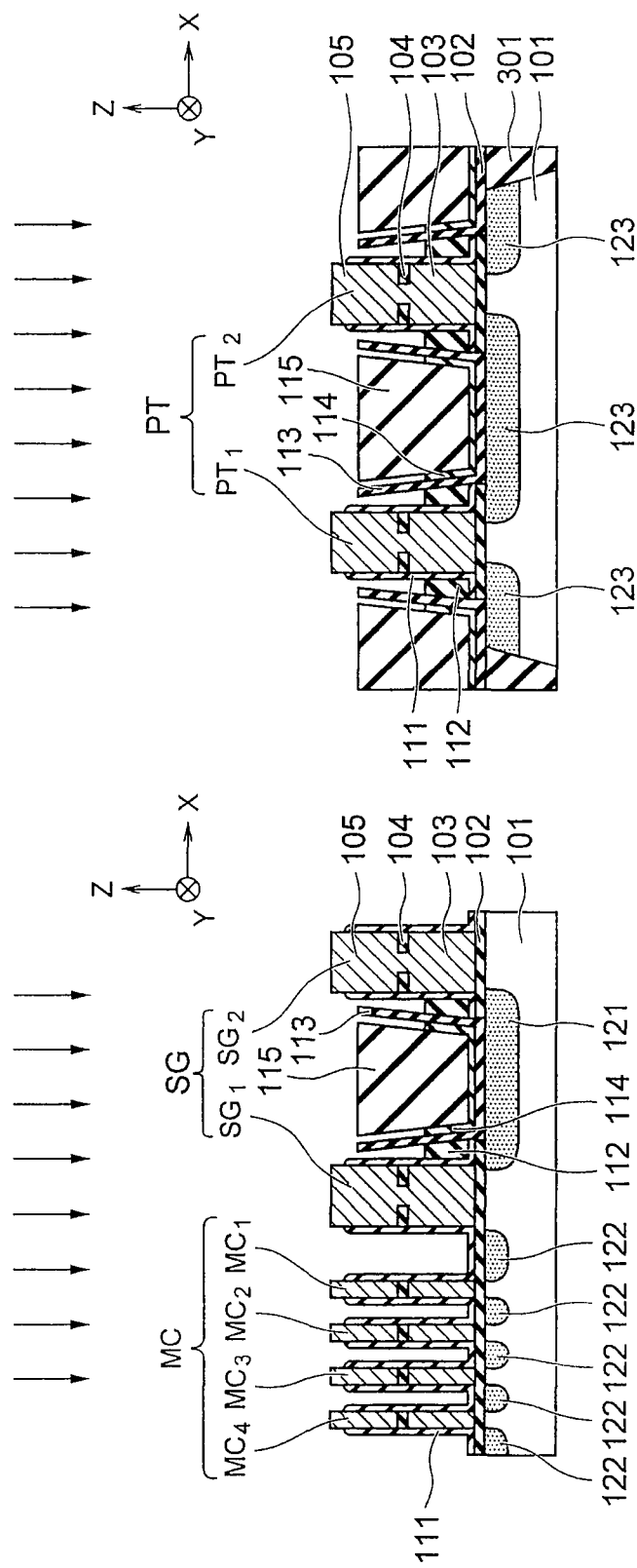

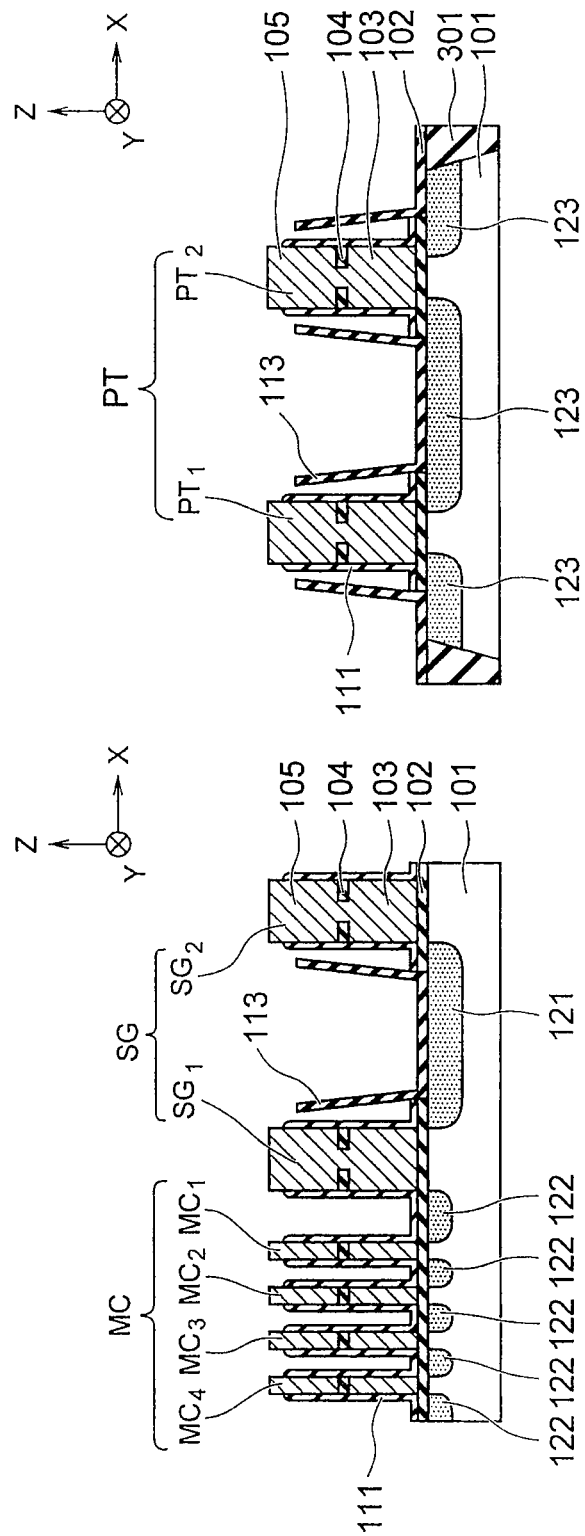

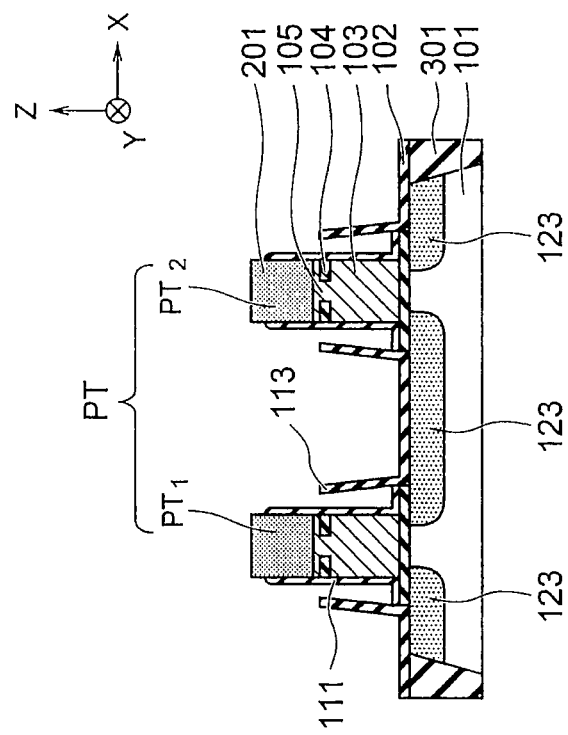
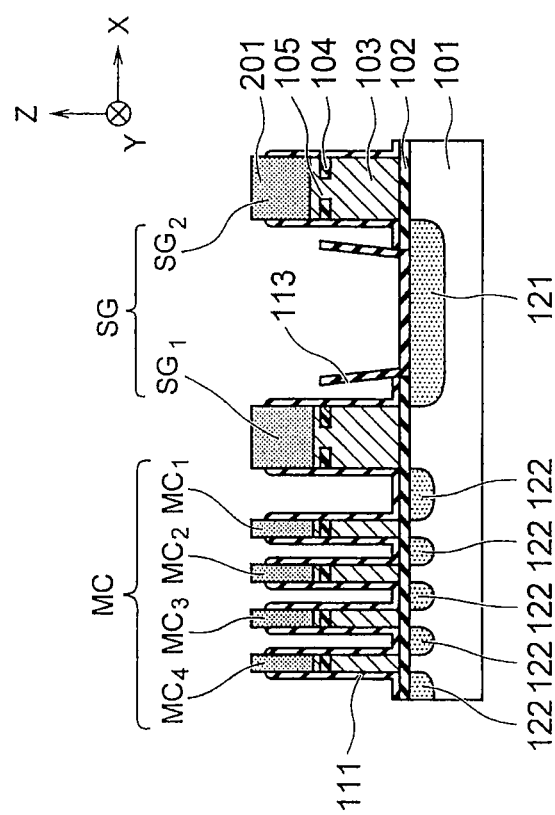

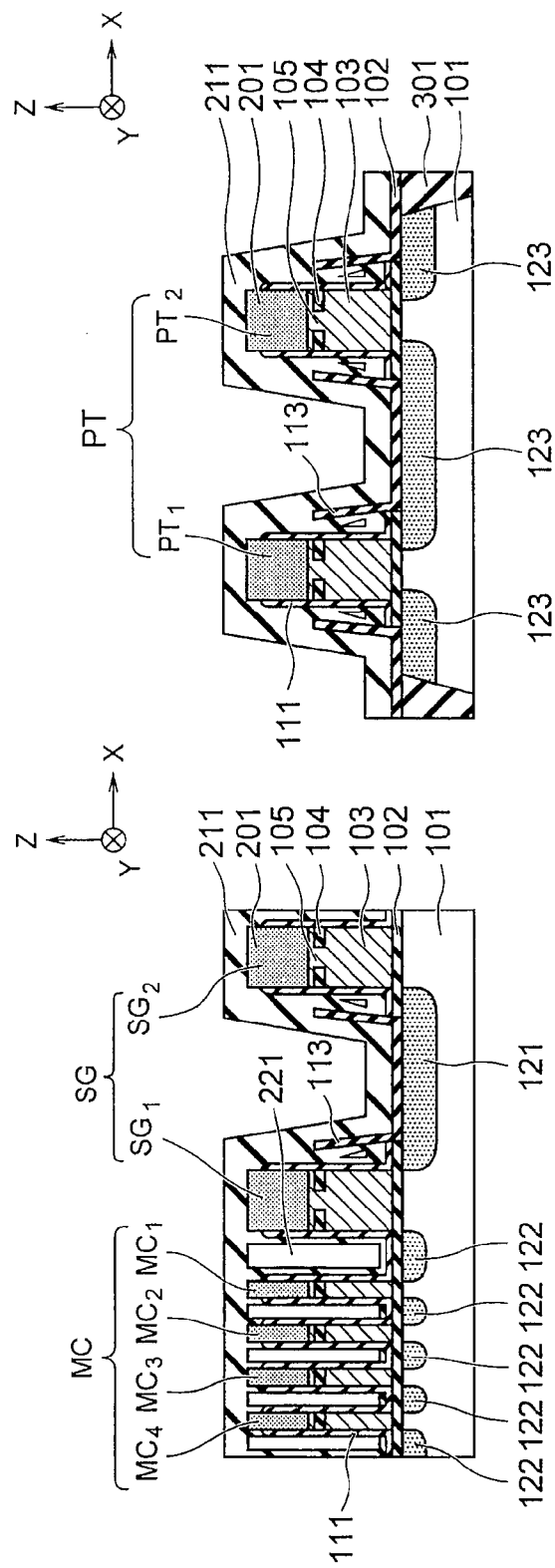

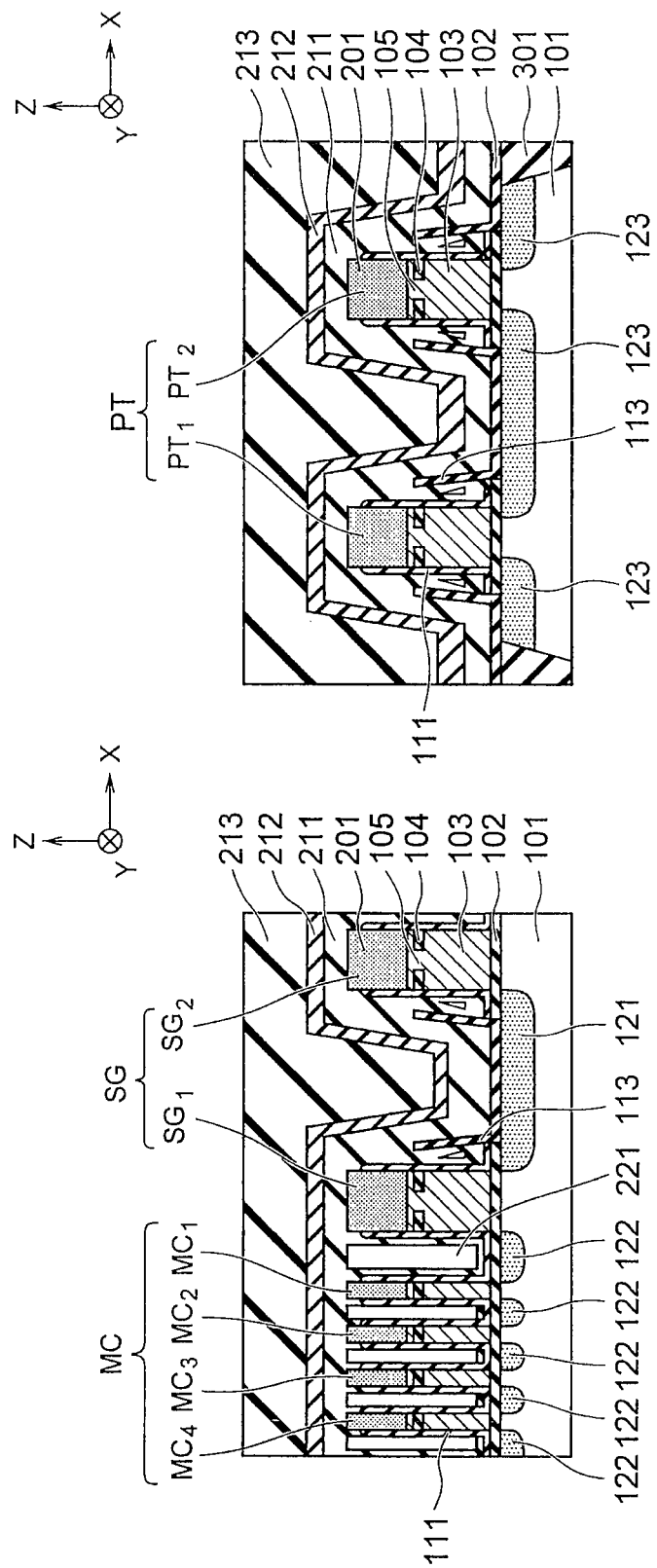

METHOD OF MANUFACTURING NONVOLATILE SEMICONDUCTOR MEMORY DEVICE

CROSS REFERENCE TO RELATED APPLICATION

This application is based upon and claims the benefit of priority from the prior Japanese Patent Application No. 2011-158012, filed on Jul. 19, 2011, the entire contents of which are incorporated herein by reference.

FIELD

Embodiments described herein relate to a method of manufacturing a nonvolatile semiconductor memory device.

BACKGROUND

A nonvolatile semiconductor memory device such as a NAND type flash memory has been increased in capacity and reduced in size year after year in accordance with the progress of micro-fabrication techniques for reducing the size of memory cells of the device. It is desired for the device to further improve the yield and reduce the cost.

In a NAND process, when forming an air gap between memory cell transistors, a sacrificial layer is formed between memory cell transistors, in sidewall insulators of selection transistors, and in sidewall insulators of peripheral transistors, and then the sacrificial layer is removed, for example. An example of the sacrificial layer includes a silicon nitride (SiN) layer.

However, when removing the sacrificial layer, a part of the sacrificial layer may remain depending on the processing condition. When the sacrificial layer remains, the characteristics of the transistors are changed. In particular, in the case where the sacrificial layer is made of the SiN layer, when a high voltage such as a write or read voltage is applied, electric charges may be trapped in the SiN layer and thereby the threshold voltages of the transistors are changed to make the circuit operation difficult. Therefore, it is desirable to prevent the sacrificial layer from remaining.

BRIEF DESCRIPTION OF THE DRAWINGS

FIGS. 1A to 5B are side cross-sectional views showing a method of manufacturing a nonvolatile semiconductor memory device of a first embodiment; and FIGS. 6A to 19B are side cross-sectional views showing a method of manufacturing a nonvolatile semiconductor memory of a second embodiment.

DETAILED DESCRIPTION

Figure 2A:
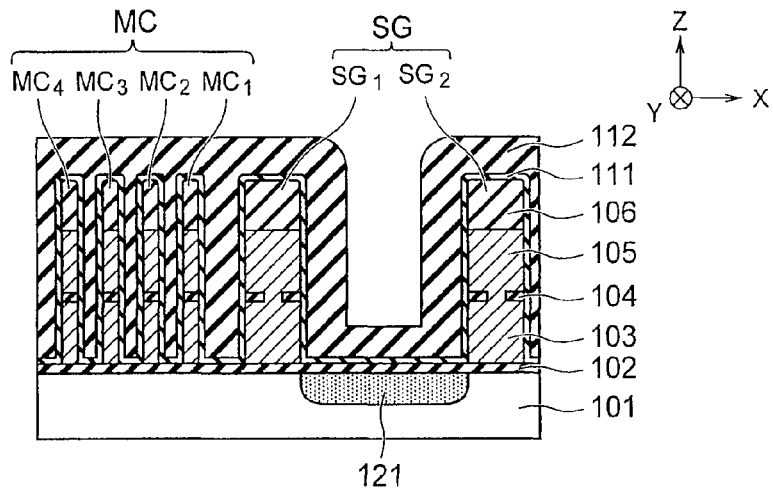

Embodiments will now be explained with reference to the accompanying drawings.

An embodiment described herein is a method of manufacturing a nonvolatile semiconductor memory device, the method including forming a plurality of memory cell transistors and a plurality of selection transistors on a substrate. The method further includes burying first and second insulators successively between memory cell transistors and between a memory cell transistor and a selection transistor, and forming the first and second insulators successively on side surfaces of selection transistors, the side surfaces facing a space between the selection transistors. The method further includes burying third to fifth insulators successively between the selection transistors via the first and second insulators. The method further includes removing the second and fourth insulators by a first etching so that the second and fourth insulators partially remain between the selection transistors. The method further includes removing the second and fourth insulators remaining between the selection transistors by a second etching performed after the first etching.

First Embodiment

FIGS. 1A to 5B are side cross-sectional views showing a method of manufacturing a nonvolatile semiconductor memory device of a first embodiment. The device is a NAND type flash memory.

First, as shown in FIG. 1A, a plurality of memory cell transistors MC and a plurality of selection transistors SG are formed on a substrate 101. The substrate 101 is a semiconductor substrate such as a silicon substrate, for example.

FIG. 1A shows memory cell transistors $MC_1$ to $MC_4$ which configure one NAND string, as an example. FIG. 1A further shows a selection transistor $SG_1$ which configures the NAND string, and a selection transistor $SG_2$ adjacent to the selection transistor $SG_1$.

FIG. 1A shows X and Y directions in parallel with the main surface of the substrate 101, and a Z direction perpendicular to the main surface of the substrate 101. The X, Y and Z directions are perpendicular to each other. The X direction corresponds to a direction in which the NAND string is extended.

As shown in FIG. 1A, each of the memory cell transistors MC and the selection transistors SG includes a first insulating layer (gate insulator) 102, a first electrode layer (floating gate layer) 103, a second insulating layer (intergate insulator) 104, a second electrode layer (control gate layer) 105, and a cap layer 106 which are formed in this order on the substrate 101.

The second electrode layer 105 in each memory cell transistor MC configures a word line (including a dummy word line) extended in the Y direction. On the other hand, the second electrode layer 105 in each selection transistor SG configures a selection line extended in the Y direction. Further, the first and second electrode layers 103 and 105 in the selection transistor $SG_1$ are electrically connected to each other by an opening $H_1$ formed in the second insulating layer 104, so as to form a gate electrode of the selection transistor $SG_1$. Also, an opening $H_2$ and a gate electrode are similarly formed in the selection transistor $SG_2$.

Next, as shown in FIG. 1A, a sidewall insulator 111 is formed over the whole surface of the substrate 101. As a result, the side surfaces of the memory cell transistors MC and of the selection transistors SG are covered with the sidewall insulator 111. The sidewall insulator 111 is an example of a first insulator. The sidewall insulator 111 is, for example, a silicon oxide ($SiO_2$) layer.

Next, as shown in FIG. 1B, the substrate 101 between the memory cell transistors MC, and the substrate 101 between the memory cell transistor MC and the selection transistor SG are covered with a resist layer 131.

Next, as shown in FIG. 1B, impurity ions are implanted into the substrate 101 by using the resist layer 131 as a mask. As a result, a first diffusion layer 121 is formed in the substrate 101 between the selection transistors SG. Examples of the impurity used in the ion implantation include B (boron) in the case of forming a P-type diffusion layer, and As (arsenic) in the case of forming an N-type diffusion layer.

Next, as shown in FIG. 1C, the resist layer 131 is removed from the substrate 101.

Next, as shown in FIG. 2A, a first sacrificial layer 112 is formed over the whole surface of the substrate 101. The thickness of the first sacrificial layer 112 is set to a thickness at which the gap between the memory cell transistors MC and the gap between the memory cell transistor MC and the selection transistor SG are filled with the first sacrificial layer 112. The first sacrificial layer 112 is an example of a second insulator. The first sacrificial layer 112 is, for example, a silicon nitride (SiN) layer.

Figure 2B:
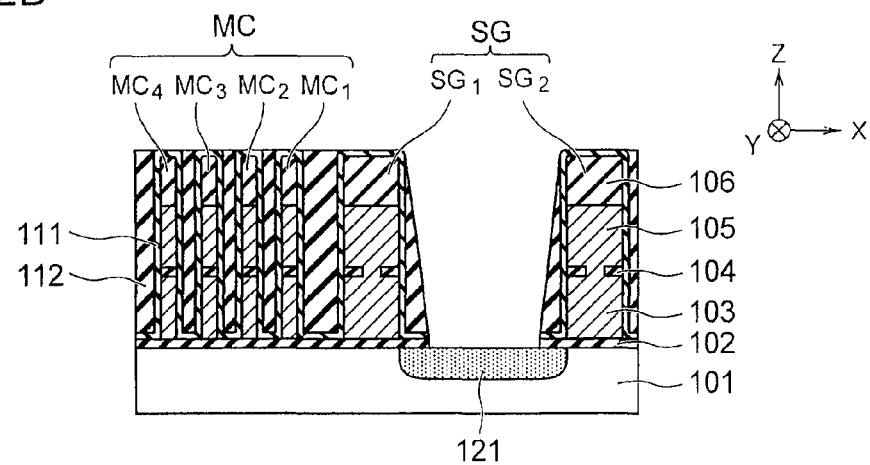

Next, as shown in FIG. 2B, the first insulating layer 102, the sidewall insulator 111, and the first sacrificial layer 112 on the surface of the substrate 101 between the selection transistors SG are removed by RIE (Reactive Ion Etching).

As a result, the sidewall insulator 111 and the first sacrificial layer 112 are processed into the shapes as shown in FIG. 2B. As shown in FIG. 2B, the sidewall insulator 111 and the first sacrificial layer 112 are buried in this order between the memory cell transistors MC, and between the memory cell transistor MC and the selection transistor SG, while the sidewall insulator 111 and the first sacrificial layer 112 are formed in this order on side surfaces of the selection transistors SG, facing the space between the selection transistors SG.

Figure 2C:
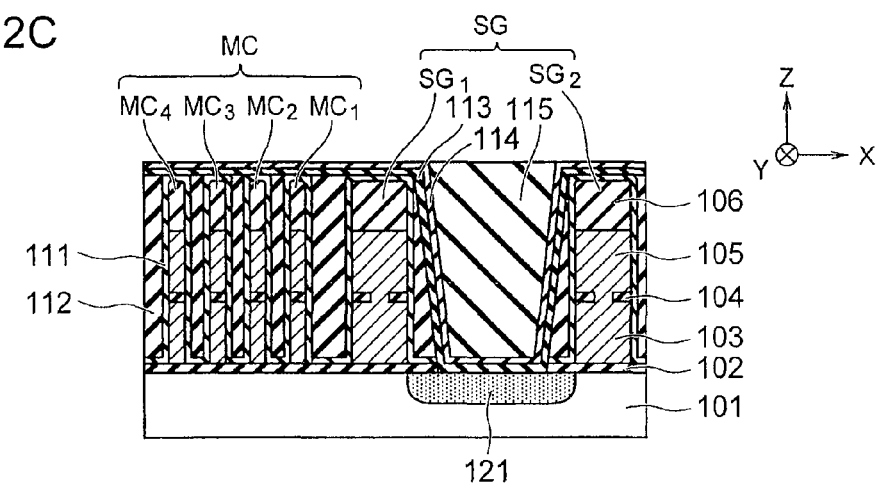

Next, as shown in FIG. 2C, an underlying insulator 113, a second sacrificial layer 114, and a third sacrificial layer 115 are formed in this order over the whole surface of the substrate 101. The thickness of the third sacrificial layer 115 is set to a thickness at which the gap between the selection transistors SG is filled with the third sacrificial layer 115, and the surface of the third sacrificial layer 115 is planarized by CMP (Chemical Mechanical Polishing). The planarization is continued until the second sacrificial layer 114 is exposed. The underlying insulator 113, the second sacrificial layer 114, and the third sacrificial layer 115 are examples of third, fourth and fifth insulators, respectively. The underlying insulator 113, the second sacrificial layer 114, and the third sacrificial layer 115 are, for example, a silicon oxide layer, a silicon nitride layer, and a BSG (Boro-Silicate Glass) layer, respectively.

Figure 3A:
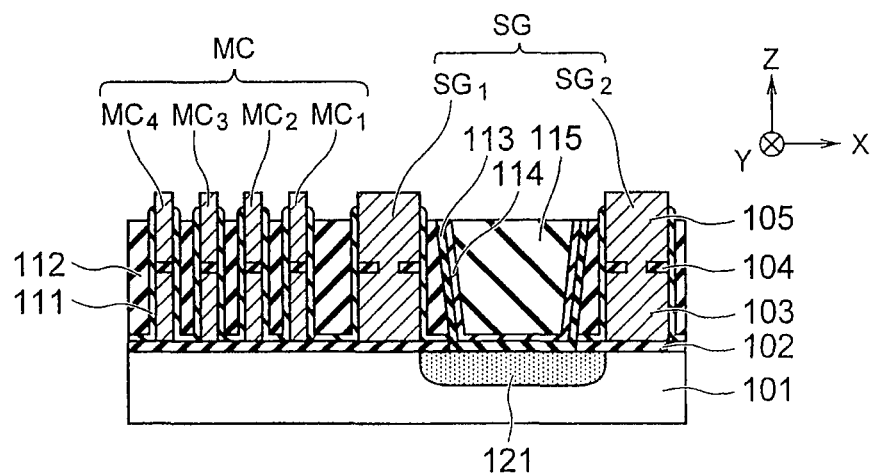

Next, as shown in FIG. 3A, RIE processing is performed until the upper surface of the second electrode layer 105 is exposed. As a result, the sidewall insulator 111, the first sacrificial layer 112, the underlying insulator 113, the second sacrificial layer 114, and the third sacrificial layer 115 are processed into the shapes as shown in FIG. 3A. In FIG. 3A, the underlying insulator 113, the second sacrificial layer 114, and the third sacrificial layer 115 are buried between the selection transistors SG via the sidewall insulator 111 and the first sacrificial layer 112.

Figure 3B:
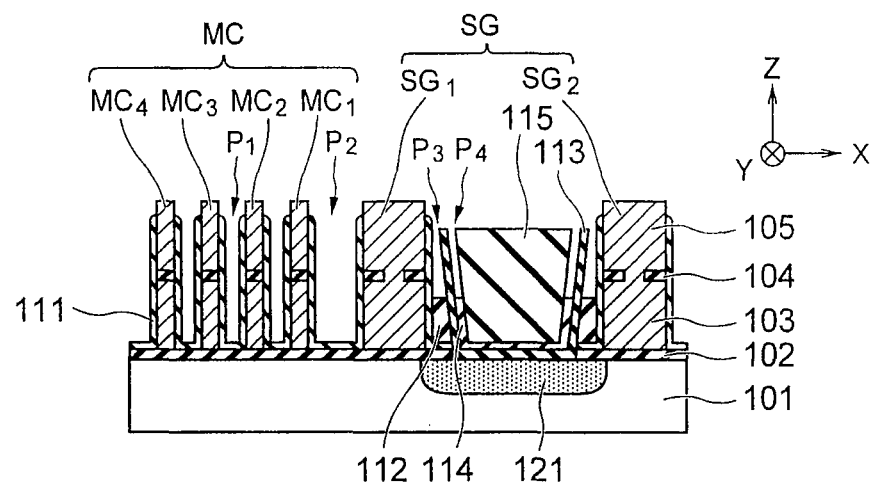

Next, as shown in FIG. 3B, the first and second sacrificial layers 112 and 114, which are insulators of the same kind (e.g., SiN layers), are removed by wet etching. The wet etching is an example of a first etching. An example of a chemical solution for the wet etching includes a phosphoric acid ($H_3PO_4$) aqueous solution.

The character $P_1$ shown in FIG. 3B denotes a gap formed by removing the first sacrificial layer 112 between the memory cell transistors MC. The character $P_2$ denotes a gap formed by removing the first sacrificial layer 112 between the memory cell transistor MC and the selection transistor SG. The characters $P_3$ and $P_4$ denote gaps formed by removing the first sacrificial layer 112 and the second sacrificial layer 114 between the selection transistors SG, respectively.

The width of the opening of the gap $P_1$ is, for example, about 20 nm, and the width of the opening of the gap $P_2$ is, for example, about 40 nm. The width of the openings of the gaps $P_3$ and $P_4$ is about 10 to 15 nm.

In this way, the width of the openings of the gaps $P_3$ and $P_4$ is set to be smaller than the width of the openings of the gaps $P_1$ and $P_2$, in the present embodiment. For this reason, the first and second sacrificial layers 112 and 114 in the gaps $P_3$ and $P_4$ are more difficult to be removed by the wet etching as compared with the first sacrificial layer 112 in the gaps $P_1$ and $P_2$.

Therefore, in the present embodiment, a state as shown in FIG. 3B is caused by the wet etching. In FIG. 3B, the first sacrificial layer 112 in the gaps $P_1$ and $P_2$ are completely removed, while the first and second sacrificial layers 112 and 114 in the gaps $P_3$ and $P_4$ are partially left.

Note that the wet etching, which completely removes the first sacrificial layer 112 in the gaps $P_1$ and $P_2$ and which partially leaves the first and second sacrificial layers 112 and 114 in the gaps $P_3$ and $P_4$, can be realized by adjusting the etching processing time, for example. The gaps $P_1$, $P_3$ and $P_4$ are examples of first to third gaps, respectively.

Figure 3C:
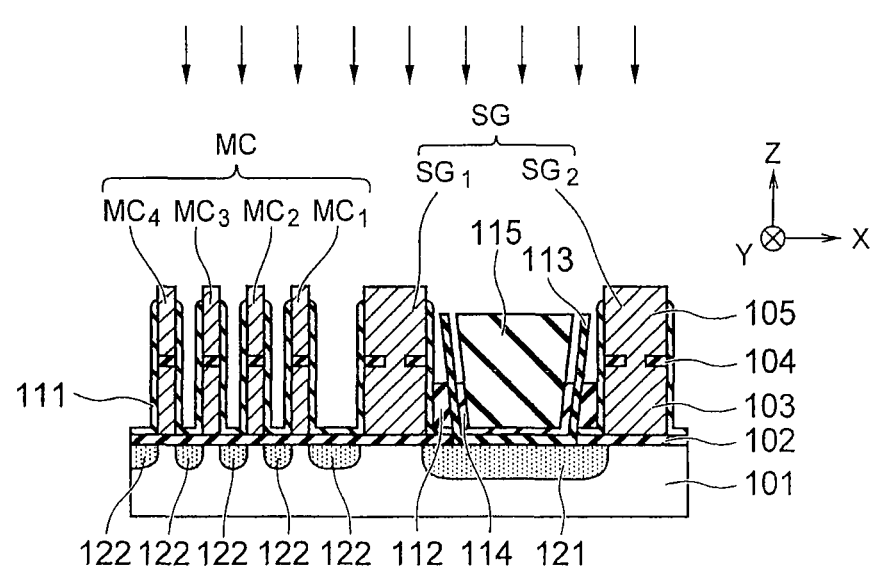

In the process shown in FIG. 3C, the first and second sacrificial layers 112 and 114 left in the gaps $P_3$ and $P_4$ are positively utilized. Specifically, as shown in FIG. 3C, impurity ions are implanted into the substrate 101 by using the sidewall insulator 111, the first sacrificial layer 112, the underlying insulator 113, the second sacrificial layer 114, and the third sacrificial layer 115 as a mask.

As a result, a second diffusion layer 122 is formed in the substrate 101 between the memory cell transistors MC, and between the memory cell transistor MC and the selection transistor SG. Examples of the impurity used by the ion implantation include B (boron) at the time of forming a P-type diffusion layer, and As (arsenic) at the time of forming an N-type diffusion layer.

Note that the second diffusion layer 122 is not formed in the substrate 101 between the selection transistors SG since the substrate 101 between the selection transistors SG is covered with the mask.

Figure 4A:
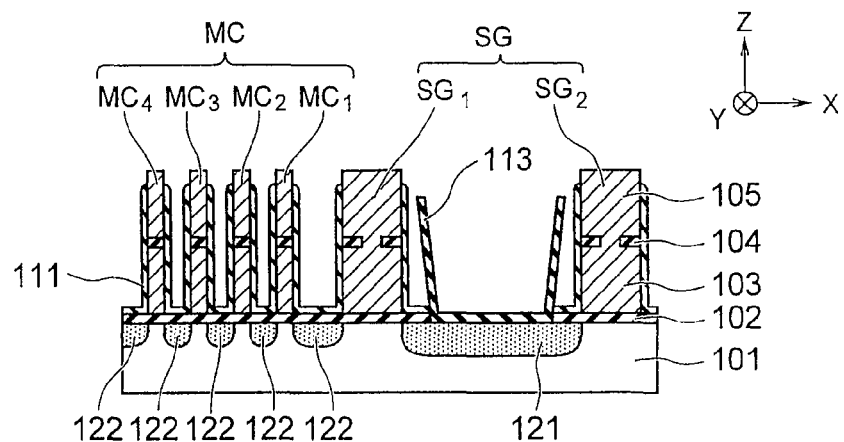

Next, as shown in FIG. 4A, the first and second sacrificial layers 112 and 114 left in the gaps $P_3$ and $P_4$, and the third sacrificial layer 115 are removed by wet etching. This wet etching is an example of a second etching. An example of a chemical solution for this wet etching includes a phosphoric acid aqueous solution. This process is performed to avoid the state in which the sacrificial layers 112 and 114 are finally left to change the characteristics of the selection transistors SG.

Figure 4B:
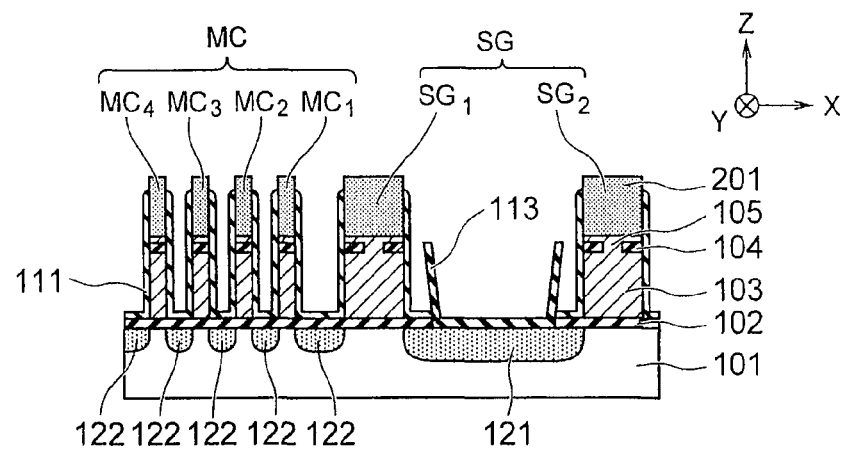

Next, as shown in FIG. 4B, a metal layer (e.g., Ni (nickel) layer) is deposited over the whole surface of the substrate 101, and silicide reaction is generated by heat treatment to form a silicide layer 201 in the second electrode layer 105. Examples of the material of the metal layer other than Ni include Ti, Co, Pt, Pd, Ta, Mo and the like.

Figure 4C:
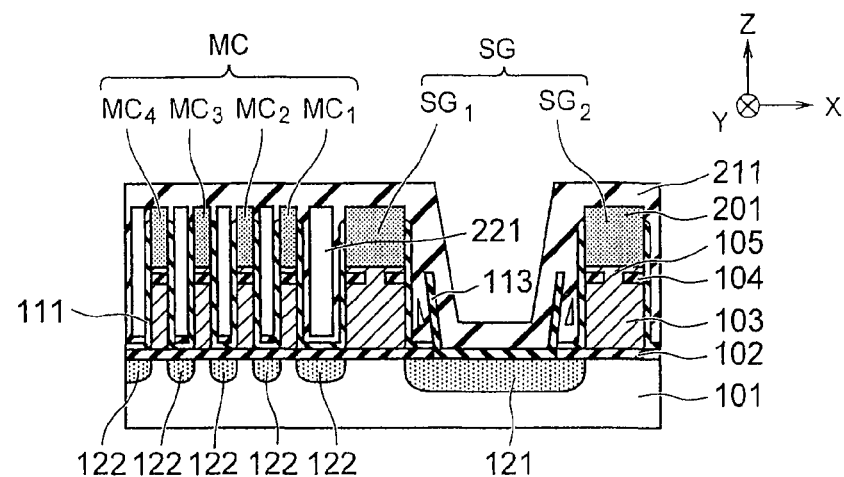

Next, as shown in FIG. 4C, a first inter layer dielectric 211 is formed over the whole surface of the substrate 101. The first inter layer dielectric 211 is an example of a sixth insulator. The first inter layer dielectric 211 is, for example, a TEOS layer.

In the present embodiment, examples of the material and the formation conditions of the first inter layer dielectric 211 include a material having poor embedding properties and conditions causing poor embedding properties. As a result, after forming the first inter layer dielectric 211, air gaps 221 remain between the memory cell transistors MC, between the memory cell transistor MC and the selection transistor SG, and in the sidewall portions of the selection transistors SG.

Figure 5A:
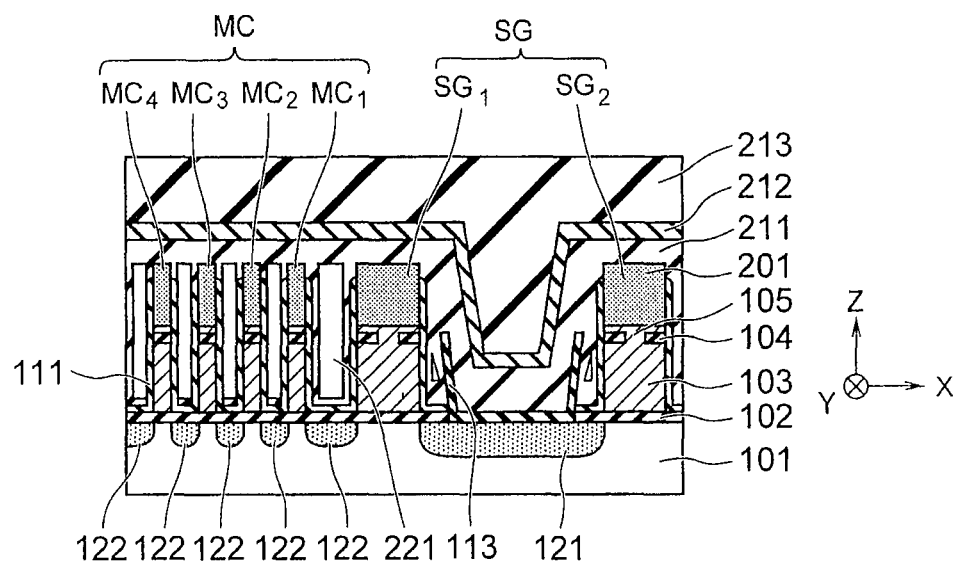

Next, as shown in FIG. 5A, second and third inter layer dielectrics 212 and 213 are formed in this order on the first inter layer dielectric 211. The second and third inter layer dielectrics 212 and 213 are, for example, a silicon nitride layer and a NSG (Non-doped Silicate Glass) layer, respectively.

Figure 5B:
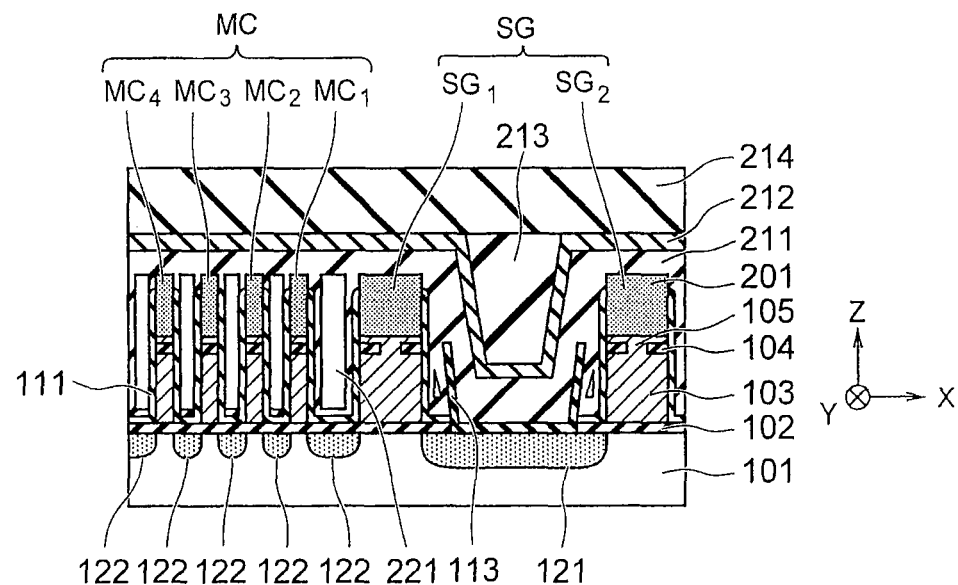

Next, as shown in FIG. 5B, the surface of the third inter layer dielectric 213 is planarized by CMP. The planarization is continued until the second inter layer dielectric 212 is exposed. Next, an fourth inter layer dielectric 214 is formed on the second and third inter layer dielectrics 212 and 213. The fourth inter layer dielectric 214 is a TEOS layer, for example.

In the present embodiment, interconnect layers, via plugs, inter layer dielectrics and the like are then formed by conventional methods. In this way, the nonvolatile semiconductor memory device is manufactured.

(Details of Process in FIG. 3C)

As described above, in the process shown in FIG. 3C, impurity ions are implanted into the substrate 101 by using the sidewall insulator 111, the first sacrificial layer 112, the underlying insulator 113, the second sacrificial layer 114, and the third sacrificial layer 115 as a mask. In the following, the details of this process will be described.

First, the impurity concentration profiles in the first and second diffusion layers 121 and 122 are described in detail.

In the process of FIG. 3C, the second diffusion layer 122 is formed in the substrate 101. On the other hand, the first diffusion layer 121 is formed in the process of FIG. 1B. Therefore, in the present embodiment, the impurity concentration profiles in the first and second diffusion layers 121 and 122 can be made different from each other regardless of whether the kind of dopant is the same or not.

In the present embodiment, the depth at which the impurity concentration in the second diffusion layer 122 becomes a maximum is set to be different from the depth at which the impurity concentration in the first diffusion layer 121 becomes a maximum, for example. Further, in the present embodiment, the peak value of the impurity concentration in the second diffusion layer 122 is set to be different from the peak value of the impurity concentration in the first diffusion layer 121, for example.

In the present embodiment, the first diffusion layer 121 is formed by implanting boron into the substrate 101 at 30 keV, and the second diffusion layer 122 is formed by implanting boron into the substrate 101 at 10 keV, for example. As a result, the impurity concentration profiles in the first and second diffusion layers 121 and 122 are made different from each other.

Next, the ion implantation into the second electrode layers 105 is described in detail.

In the process of FIG. 3C, impurity ions are implanted into the substrate 101 in the state where the upper surfaces of the memory cell transistors MC and the selection transistors SG are not covered with a mask. Therefore, due to this ion implantation, impurity ions are implanted not only into the substrate 101 but also into the second electrode layers 105 of the memory cell transistors MC and the selection transistors SG.

Note that the impurity ions are also implanted into the second electrode layers 105 of peripheral transistors PT described below.

Effects of First Embodiment

Finally, effects of the first embodiment are described.

In the present embodiment, the first and second sacrificial layers 112 and 114, which are insulators of the same kind, are removed by the first and second etchings. Specifically, in the first etching, the sacrificial layers 112 and 114 are removed so that the sacrificial layers 112 and 114 partially remain between the selection transistors SG. The sacrificial layers 112 and 114 remaining between the selection transistors SG are then removed by the second etching.

Therefore, in the present embodiment, the sacrificial layers 112 and 114 between the selection transistors SG, which layers are hard to be removed, can be surely removed. Therefore, according to the present embodiment, the sacrificial layers 112 and 114 can be prevented from being left, and hence it is possible to suppress that the characteristics of the transistors are changed by the residual sacrificial layers 112 and 114.

Note that the conditions of the second etching may be different from the conditions of the first etching. Examples of the conditions include processing temperature, processing time, the kind of chemical solution, the concentration of chemical solution and the like.

Further, in the present embodiment, the sacrificial layers 112 and 114 left in the first etching are positively utilized. Specifically, the sidewall insulator 111, the first sacrificial layer 112, the underlying insulator 113, the second sacrificial layer 114, and the third sacrificial layer 115 are used as a mask for ion implantation.

Therefore, according to the present embodiment, the manufacturing cost of the nonvolatile semiconductor memory can be reduced by reducing the number of lithography processes.

Second Embodiment

In the following, a second embodiment, which is a modification of the first embodiment, will be described focusing on the differences from the first embodiment.

FIGS. 6A to 19B are side cross-sectional views showing a method of manufacturing a nonvolatile semiconductor memory of the second embodiment.

Figure 19A:
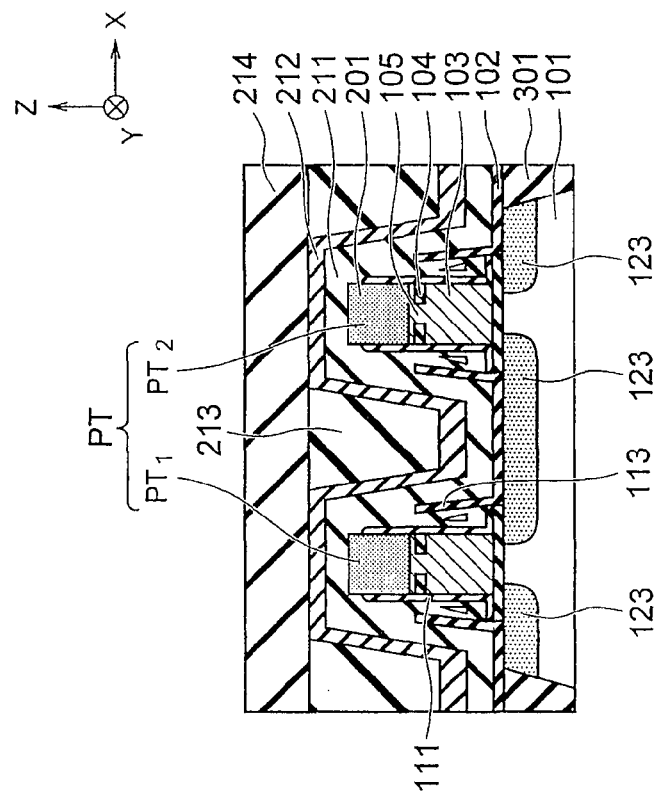

FIG. 6A, FIG. 7A, . . . and FIG. 19A show a plurality of memory cell transistors MC and a plurality of selection transistors SG arranged in the memory cell array part on the substrate 101.

Figure 19B:
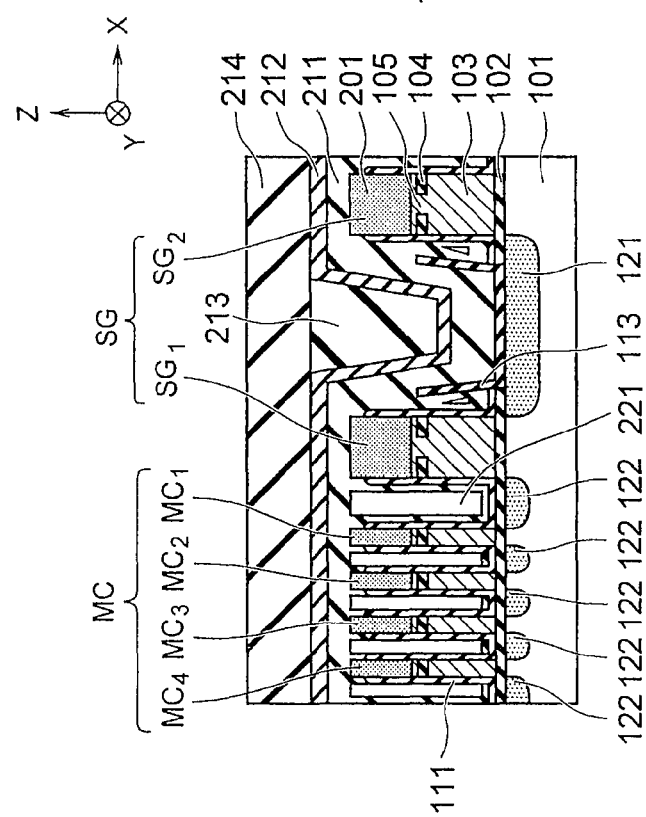

On the other hand, FIG. 6B, FIG. 7B, . . . and FIG. 19B show a plurality of peripheral transistors PT arranged in a peripheral circuit part on the substrate 101. The peripheral circuit part is arranged adjacent to the memory cell array part on the substrate 101. Examples of the peripheral transistors PT include LV (low voltage) transistors and HV (high voltage) transistors.

Each processing shown in FIG. 6A, FIG. 7A, . . . and FIG. 19A is performed similarly to that shown in FIG. 1A, FIG. 1B, . . . and FIG. 5B. Further, each processing shown in FIG. 6B, FIG. 7B, . . . and FIG. 19B is performed in parallel with that shown in FIG. 6A, FIG. 7A, . . . and FIG. 19A.

In the following, the processing shown in FIGS. 6A to 19B will be described in detail.

First, as shown in FIGS. 6A and 6B, the plurality of memory cell transistors MC, the plurality of selection transistors SG, and the plurality of peripheral transistors PT are formed on the substrate 101.

FIG. 6B shows peripheral transistors $PT_1$ and $PT_2$ which are arranged adjacent to each other. The first and second electrode layers 103 and 105 of the peripheral transistor $PT_1$ are electrically connected to each other by an opening $H_3$ formed in the second insulating layer 104 so as to form a gate electrode of the peripheral transistor $PT_1$. Also, a gate electrode and an opening $H_4$ of the peripheral transistor $PT_2$ are similarly formed. Note that the numeral 301 denotes isolation insulators 301 formed in the substrate 101.

Next, as shown in FIGS. 6A and 6B, the sidewall insulator 111 is formed over the whole surface of the substrate 101. As a result, the side surfaces of the memory cell transistor MC, the selection transistor SG, and the peripheral transistor PT are covered with the sidewall insulator 111.

Next, as shown in FIGS. 7A and 7B, the spaces between the memory cell transistors MC, between the memory cell transistor MC and the selection transistor SG, and on the substrate 101 in the peripheral circuit part are covered with the resist layer 131. Then, impurity ions are implanted into the substrate 101 by using the resist film 131 as a mask. As a result, the first diffusion layer 121 is formed in the substrate 101 between the selection transistors SG.

Figure 8B:
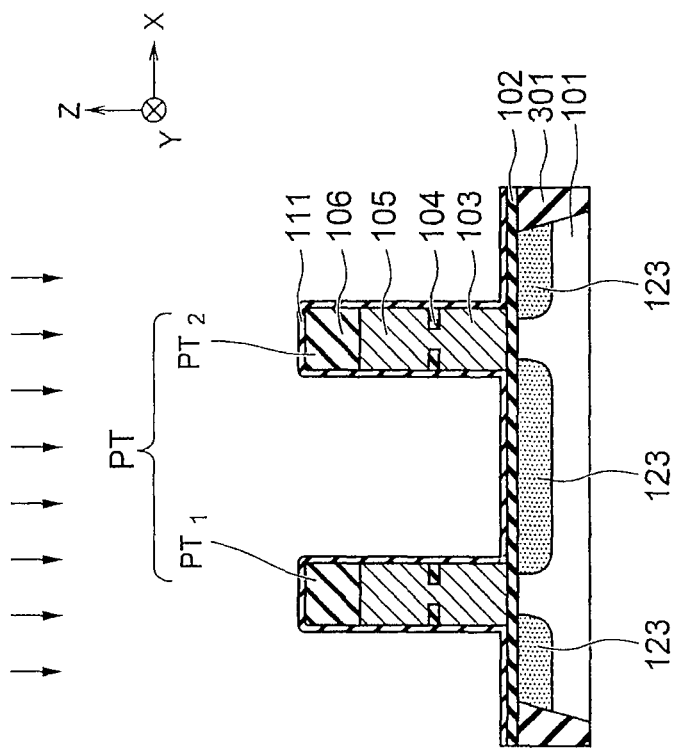
Figure 8A:
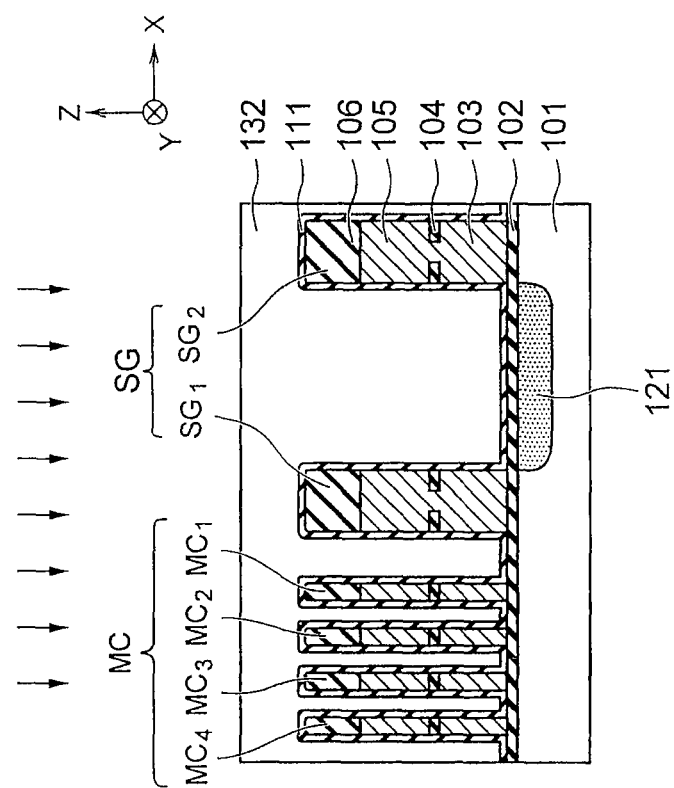

Next, as shown in FIGS. 8A and 8B, after the resist layer 131 is removed from the substrate 101, the substrate 101 in the memory cell portion is covered with a resist layer 132. Then, ion implantation into the substrate 101 is performed by using the resist layer 132 as a mask. As a result, a third diffusion layer 123 is formed in the substrate 101 between the peripheral transistors PT. Then, the resist layer 132 is removed from the substrate 101.

Next, as shown in FIGS. 9A and 9B, the first sacrificial layer 112 is formed over the whole surface of the substrate 101.

Figure 10A:
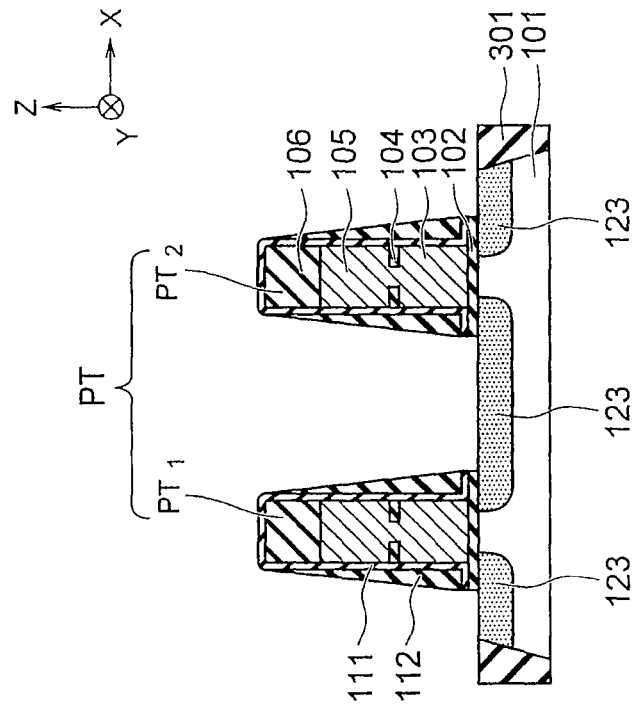
Figure 10B:
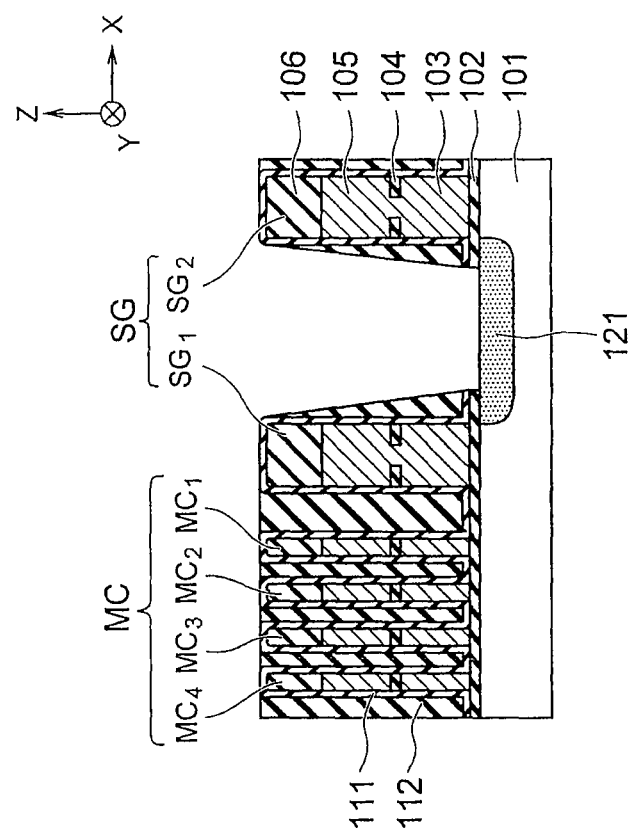

Next, as shown in FIGS. 10A and 10B, the first insulating layer 102, the sidewall insulator 111, and the first sacrificial layer 112, which are formed on the surfaces of the substrate 101 between the selection transistors SG and between peripheral transistors PT are removed by RIE.

As a result, the sidewall insulator 111 and the first sacrificial layer 112 are processed into shapes as shown in FIGS. 10A and 10B. In FIG. 10B, the sidewall insulator 111 and the first sacrificial layer 112 are formed in this order on the side surfaces of the peripheral transistors PT, facing the space between the peripheral transistors PT.

Next, as shown in FIGS. 11A and 11B, the underlying insulator 113, the second sacrificial layer 114, and the third sacrificial layer 115 are formed in this order over the whole surface of the substrate 101. Then, the surface of the third sacrificial layer 115 is planarized by CMP. The planarization is continued until the second sacrificial layer 114 is exposed.

Next, as shown in FIGS. 12A and 12B, RIE processing is performed until the upper surface of the second electrode layer 105 is exposed. As a result, the sidewall insulator 111, the first sacrificial layer 112, the underlying insulator 113, the second sacrificial layer 114, and the third sacrificial layer 115 are processed into the shapes as shown in FIGS. 12A and 12B. In FIG. 12B, the underlying insulator 113, the second sacrificial layer 114, and the third sacrificial layer 115 are buried in the space between the peripheral transistors PT via the sidewall insulator 111 and the first sacrificial layer 112.

Next, as shown in FIGS. 13A and 13B, the first and second sacrificial layers 112 and 114, which are the same kind of insulators (e.g., SiN layers), are removed by wet etching.

The character $P_1$ shown in FIG. 13A denotes a gap formed by removing the first sacrificial layer 112 between the memory cell transistors MC. Further, the character $P_2$ shown in FIG. 13A denotes a gap formed by removing the first sacrificial layer 112 between the memory cell transistor MC and the selection transistor SG.

Further, the characters $P_3$ and $P_4$ shown in FIG. 13A denote gaps formed by removing the first sacrificial layer 112 and the second sacrificial layer 114 between the selection transistors SG, respectively. Further, characters $P_5$ and $P_6$ shown in FIG. 13B denote gaps formed by removing the first sacrificial layer 112 and the second sacrificial layer 114 between the peripheral transistors PT, respectively.

The width of the opening of the gap $P_1$ is about 20 nm, and the width of the opening of gap $P_2$ is about 40 nm, for example. Further, the width of the openings of the gaps $P_3$ to $P_6$ is about 10 to 15 nm, for example.

In this way, in the present embodiment, the width of the openings of the gaps $P_3$ to $P_6$ is set to be smaller than the width of the openings of the gap $P_1$ and the gap $P_2$. For this reason, the first and second sacrificial layers 112 and 114 in the gaps $P_3$ to $P_6$ are more difficult to be removed by the wet etching than the first sacrificial layer 112 in the gaps $P_1$ and $P_2$.

Therefore, in the present embodiment, the state as shown in FIGS. 13A and 13B is generated by the wet etching. In FIGS. 13A and 13B, the first sacrificial layer 112 in the gaps $P_1$ and $P_2$ is completely removed, while the first and second sacrificial layers 112 and 114 in the gaps $P_3$ to $P_6$ are partially left. The gaps $P_1$, $P_3$, $P_4$, $P_5$ and $P_6$ are examples of first to fifth gaps, respectively.

In the process of FIGS. 14A and 14B, the first and second sacrificial layers 112 and 114 left in the gaps $P_3$ to $P_6$ are positively utilized. Specifically, as shown in FIGS. 14A and 14B, impurity ions are implanted into the substrate 101 by using the sidewall insulator 111, the first sacrificial layer 112, the underlying insulator 113, the second sacrificial layer 114, and the third sacrificial layer 115 as a mask.

As a result, the second diffusion layer 122 is formed in the substrate 101 between the memory cell transistors MC and between the memory cell transistor MC and the selection transistor SG.

Note that the substrate 101 between the selection transistors SG and between the peripheral transistors PT is covered with the mask, and hence the second diffusion layer 122 is not formed in the substrate 101 between the selection transistors SG and between the peripheral transistors PT.

Next, as shown in FIGS. 15A and 15B, the first and second sacrificial layers 112 and 114 which are left in the gaps $P_3$ to $P_6$, and the third sacrificial layer 115 are removed by wet etching. This process is performed to avoid the state in which the sacrificial layers 112 and 114 are finally left to change the characteristics of the selection transistors SG.

Next, as shown in FIGS. 16A and 16B, the silicide layer 201 is formed in the second electrode layer 105 in such a manner that a metal layer (e.g., Ni layer) is deposited over the whole surface of the substrate 101 and that a silicide reaction is then generated by heat treatment.

Next, as shown in FIGS. 17A and 17B, the first inter layer dielectric 211 is formed over the whole surface of the substrate 101. In the present embodiment, examples of the material and the formation conditions of the first inter layer dielectric 211 include a material having poor embedding properties and conditions causing poor embedding properties are adopted. As a result, after forming the first inter layer dielectric 211, the air gaps 221 remain between the memory cell transistors MC, between the memory cell transistor MC and the selection transistor SG, and in the sidewall portions of the selection transistors SG and the peripheral transistors PT.

Next, as shown in FIGS. 18A and 18B, the second and third inter layer dielectrics 212 and 213 are formed in this order on the first inter layer dielectric 211. Then, the surface of the third inter layer dielectric 213 is planarized by CMP. The planarization is continued until the second inter layer dielectric 212 is exposed.

Next, as shown in FIGS. 19A and 19B, the fourth inter layer dielectric 214 is formed on the second and third inter layer dielectrics 212 and 213.

In the present embodiment, interconnect layers, via plugs, inter layer dielectrics and the like are formed by conventional methods. In this way, the nonvolatile semiconductor memory is manufactured.

Effects of Second Embodiment

Finally, effects of the second embodiment are described.

As described above, in the present embodiment, the first and second sacrificial layers 112 and 114, which are insulators of the same kind, are removed by the first and second etchings similarly to the first embodiment. Specifically, in the first etching, the sacrificial layers 112 and 114 are removed so that the sacrificial layers 112 and 114 partially remain between the selection transistors SG and between the peripheral transistors PT. Then, in the second etching, the sacrificial layers 112 and 114 remaining between the selection transistors SG and between the peripheral transistors PT are removed.

Therefore, in the present embodiment, the sacrificial layers 112 and 114 between the selection transistors SG and between the peripheral transistors PT, which are difficult to be removed, can be surely removed similarly to the first embodiment. Therefore, according to the present embodiment, the sacrificial layers 112 and 114 are prevented from being left, and hence it is possible to suppress that the characteristics of the transistors are changed by the residual sacrificial layers 112 and 114.

Further, in the present embodiment, the sacrificial layers 112 and 114 left in the first etching are positively utilized. Specifically, the sidewall insulator 111, the first sacrificial layer 112, the underlying insulator 113, the second sacrificial layer 114, and the third sacrificial layer 115 are used as a mask for ion implantation.

Therefore, according to the present embodiment, the number of lithography processes is reduced, and hence it is possible to reduce the manufacturing cost of the nonvolatile semiconductor memory device.

In the following, the effect of reducing the number of lithography processes will be described in conjunction with the description of the processes shown in FIGS. 7A and 7B, FIGS. 8A and 8B, and FIGS. 14A and 14B.

In the present embodiment, the first and third diffusion layers 121 and 123 are respectively formed by the ion implantation using the resist films 131 and 132 as masks (FIGS. 7A and 7B, and FIGS. 8A and 8B). Therefore, when forming the first and second diffusion layers 121 and 123, lithography processes are performed.

Further, the second diffusion layer 122 is formed by the ion implantation using the sidewall insulator 111, the residual first sacrificial layer 112, the underlying insulator 113, the residual second sacrificial layer 114, and the third sacrificial layer 115 as a mask (FIGS. 14A and 14B). Therefore, when forming the second diffusion layer 122, no lithography process is necessary.

Accordingly, in the present embodiment, the first to third diffusion layers 121 to 123 can be formed by two lithography processes.

On the other hand, in the conventional method, at least three lithography processes need to be performed to form these diffusion layers. The first lithography process is performed to form the diffusion layer of the selection transistors SG, the second lithography process is performed to form the diffusion layer of the peripheral transistors PT, and the third lithography process is performed to form the diffusion layer of the memory cell transistors MC. This is because the diffusion layers, which are most suitable for the respective transistors, cannot be formed simultaneously due to the differences in the operation and performance which are required for each of the transistors.

However, in the present embodiment, such diffusion layers can be formed by two lithography processes. Therefore, according to the present embodiment, the number of lithography processes is reduced, and hence it is possible to reduce the manufacturing cost of the nonvolatile semiconductor memory device.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a nonvolatile semiconductor memory device, the method comprising:
    forming a plurality of memory cell transistors and a plurality of selection transistors on a substrate;
    burying first and second insulators successively between memory cell transistors and between a memory cell transistor and a selection transistor, and forming the first and second insulators successively on side surfaces of selection transistors, the side surfaces facing a space between the selection transistors;
    burying third, fourth and fifth insulators successively between the selection transistors via the first and second insulators;
    removing all the second and fourth insulators by a first etching so that the second and fourth insulators partially remain between the selection transistors; and
    removing the second and fourth insulators remaining between the selection transistors by a second etching performed after the first etching.

2. The method of claim 1, further comprising implanting impurity ions into the substrate by using the first to fifth insulators as a mask between the first and second etchings.

3. The method of claim 2, wherein the impurity ions are implanted into gate electrodes of the selection transistors.

4. The method of claim 2, wherein an impurity concentration profile of a second diffusion layer formed in the substrate by the implantation of the impurity ions is different from an impurity concentration profile of a first diffusion layer formed in the substrate between the selection transistors.

5. The method of claim 1, further comprising implanting impurity ions into the substrate between the formations of the first and second insulators, the impurity ions being implanted in a state where a mask is formed between the memory cell transistors and between the memory cell transistor and the selection transistor.

6. The method of claim 1, wherein a second gap formed by removing the second insulator between the selection transistors by the first etching is smaller than a first gap formed by removing the second insulator between the memory cell transistors by the first etching.

7. The method of claim 1, wherein a third gap formed by removing the fourth insulator between the selection transistors by the first etching is smaller than a first gap formed by removing the second insulator between the memory cell transistors by the first etching.

8. The method of claim 1, wherein the second and fourth insulators are silicon nitride layers.

9. The method of claim 8, wherein the first, third and fifth insulators are silicon oxide layers.

10. The method of claim 1, further comprising forming a sixth insulator on the substrate so that air gaps remain between the memory cell transistors, between the memory cell transistor and the selection transistor, and in sidewall portions of the selection transistors after the second etching.

11. The method of claim 1, further comprising:
forming a plurality of peripheral transistors together with the plurality of memory cell transistors and the plurality of selection transistors on the substrate;
forming the first and second insulators successively on side surfaces of peripheral transistors, the side surfaces facing a space between the peripheral transistors;
burying third, fourth and fifth insulators successively between the peripheral transistors via the first and second insulators;
removing the second and fourth insulators by the first etching so that the second and fourth insulators partially remain between the peripheral transistors;
removing all the second and fourth insulators remaining between the peripheral transistors by the second etching; and
implanting impurity ions into the substrate by using the first to fifth insulators as a mask between the first and second etchings.

12. The method of claim 11, wherein the impurity ions are implanted into gate electrodes of the selection transistors and the peripheral transistors.

13. The method of claim 11, wherein an impurity concentration profile of a second diffusion layer formed in the substrate by the implantation of the impurity ions is different from an impurity concentration profile of a first diffusion layer formed in the substrate between the selection cell transistors.

14. The method of claim 11, further comprising implanting impurity ions into the substrate between the formations of the first and second insulators, the impurity ions being implanted in a state where a mask is formed between the memory cell transistors, between the memory cell transistor and the selection transistor, and between the peripheral transistors.

15. The method of claim 11, further comprising implanting impurity ions into the substrate between the formations of the first and second insulators, the impurity ions being implanted in a state where a mask is formed between the memory cell transistors, between the memory cell transistor and the selection transistor, and between the selection transistors.

16. The method of claim 11, wherein a fourth gap formed by removing the second insulator between the peripheral transistors by the first etching is smaller than a first gap formed by removing the second insulator between the memory cell transistors by the first etching.

17. The method of claim 11, wherein a fifth gap formed by removing the fourth insulator between the peripheral transistors by the first etching is smaller than a first gap formed by removing the second insulator between the memory cell transistors by the first etching.

18. The method of claim 11, wherein the second and fourth insulators are silicon nitride layers.

19. The method of claim 18, wherein the first, third and fifth insulators are silicon oxide layers.

20. The method of claim 11, further comprising forming a sixth insulator on the substrate so that air gaps remain between the memory cell transistors, between the memory cell transistor and the selection transistor, and in sidewall portions of the selection transistors and the peripheral transistors after the second etching.

* * * * *

UNITED STATES PATENT AND TRADEMARK OFFICE
CERTIFICATE OF CORRECTION

PATENT NO. : 8,445,349 B2
APPLICATION NO. : 13/358633
DATED : May 21, 2013
INVENTOR(S) : Mitsuhiko Noda Page 1 of 1

It is certified that error appears in the above-identified patent and that said Letters Patent is hereby corrected as shown below:

On the title page, Item [30], The Foreign Application Priority Data has been omitted. Item [30] should read:

--[30]     Foreign Application Priority Data

Jul. 19, 2011     (JP) ...........................2011-158012--

Signed and Sealed this
Ninth Day of July, 2013

Teresa Stanek Rea
*Acting Director of the United States Patent and Trademark Office*